(12) United States Patent
Wang

(10) Patent No.: US 9,588,444 B2
(45) Date of Patent: Mar. 7, 2017

(54) BALANCE MASS SYSTEM SHARED BY WORKPIECE TABLE AND MASK TABLE, AND LITHOGRAPHY MACHINE

(71) Applicant: SHANGHAI MICRO ELECTRONICS EQUIPMENT CO., LTD., Shanghai (CN)

(72) Inventor: Tianming Wang, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 0 days.

(21) Appl. No.: 14/437,775

(22) PCT Filed: Sep. 23, 2013

(86) PCT No.: PCT/CN2013/084005
§ 371 (c)(1),
(2) Date: Apr. 22, 2015

(87) PCT Pub. No.: WO2014/071780
PCT Pub. Date: May 15, 2014

(65) Prior Publication Data
US 2015/0286154 A1 Oct. 8, 2015

(30) Foreign Application Priority Data
Nov. 12, 2012 (CN) .......................... 2012 1 0451784

(51) Int. Cl.
*G03F 7/20* (2006.01)
*F16F 7/10* (2006.01)
*F16F 15/00* (2006.01)

(52) U.S. Cl.
CPC ................ *G03F 7/709* (2013.01); *F16F 7/10* (2013.01); *F16F 7/1005* (2013.01);
(Continued)

(58) Field of Classification Search
CPC F16F 7/1005; G03F 7/70766; G03F 7/70716; G03F 7/70833; G03F 7/70808; G03F 7/70816; G03F 7/709
See application file for complete search history.

(56) References Cited

U.S. PATENT DOCUMENTS 5,528,118 A * 6/1996 Lee ...................... G03F 7/70716
318/38
6,879,375 B1 4/2005 Kayama
(Continued)

FOREIGN PATENT DOCUMENTS

| CN | 101364052 A1 | 2/2009 |
| CN | 202133856 U | 2/2012 |
| CN | 102537196 A1 | 7/2012 |

*Primary Examiner* — Michelle M Iacoletti
(74) *Attorney, Agent, or Firm* — Muncy, Geissler, Olds & Lowe, P.C.

(57) ABSTRACT

A balance mass system shared by a workpiece stage and a mask stage includes a balance mass and an anti-drift and compensation apparatus (16). The balance mass includes a first part (11) for mounting thereon a workpiece stage system, a second part (20) for mounting thereon a mask stage system, and a third part (14) for interconnecting the first part (11) and the second part (20). The first part (11) of the balance mass is floatingly supported on a base frame (1) of a lithography machine, and the third part (14) of the balance mass is in connection with the base frame (1) via the anti-drift and compensation apparatus (16). The anti-drift and compensation apparatus (16) is disposed in proximity to the center of gravity of the balance mass as a whole. This balance mass system can eliminate the need for using an additional support for the mask stage system and allow the construction of a lithography machine with a higher structural compactness, reduced size and weight, and reduced total mass of used balance masses.

9 Claims, 1 Drawing Sheet

(52) U.S. Cl.
CPC ........ *F16F 15/002* (2013.01); *G03F 7/70716* (2013.01); *G03F 7/70766* (2013.01); *G03F 7/70808* (2013.01); *G03F 7/70833* (2013.01); *G03F 7/70816* (2013.01)

(56) References Cited

U.S. PATENT DOCUMENTS

| | | | |
|---|---|---|---|
| 6,885,430 B2 | 4/2005 | Tanaka et al. | |
| 7,034,920 B2 | 4/2006 | Kwan et al. | |
| 2002/0048009 A1* | 4/2002 | Kwan | G03F 7/70716 355/72 |
| 2004/0008331 A1* | 1/2004 | Cox | B23Q 1/58 355/53 |
| 2006/0215133 A1 | 9/2006 | Hazelton | |
| 2009/0086177 A1* | 4/2009 | Vosters | G03F 7/70716 355/53 |
| 2009/0262325 A1* | 10/2009 | Butler | G03F 7/70758 355/72 |

* cited by examiner

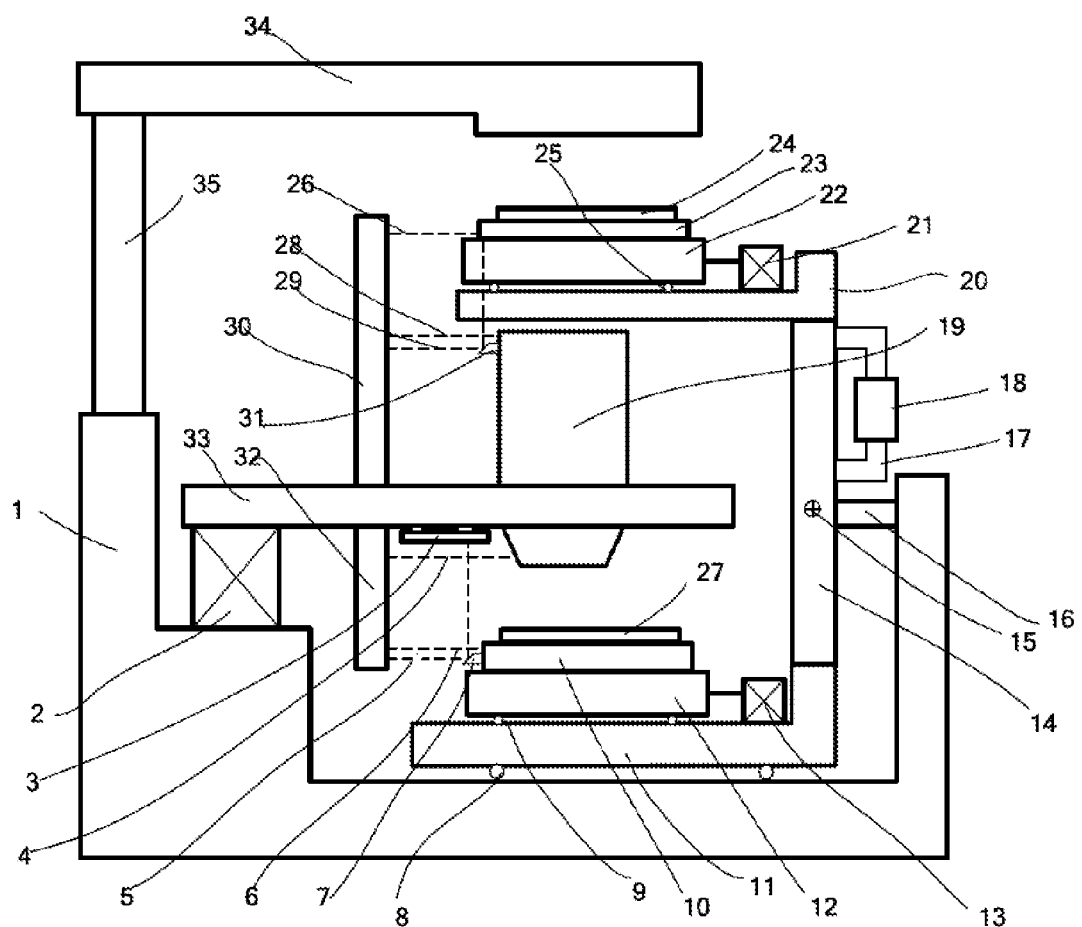

BALANCE MASS SYSTEM SHARED BY WORKPIECE TABLE AND MASK TABLE, AND LITHOGRAPHY MACHINE

TECHNICAL FIELD

The present invention relates to lithographic apparatuses, and in particular, to a balance mass system shared by a workpiece table and a mask table and to a lithography machine.

BACKGROUND

Lithographic accuracy and throughput of a lithography machine are direct determinants for the integration and manufacturing costs of integrated circuit (IC) chips. However, the throughput and the lithographic accuracy are conflicting to each other. IC manufacturers are pursuing lithography machines with both a high-throughput capability and an ability to perform high-quality, high-accuracy exposures. The accuracy of the lithography machine will be affected and impaired by any vibrations, even tiny in magnitude, generated within the lithography machine, and will especially be affected by the reaction forces generated upon driving the object tables.

To overcome this problem, a technique that uses balance mass has been developed. This technique of balance mass can minimize the reaction forces from the object tables that are transferred to the base frame of the machine, thereby greatly reducing difficulties in vibration damping for the lithography machine and reliving the exposure system from the interference of the reaction forces.

The existing balance mass systems for object tables are mainly categorized into two types which are single-layered structure and double-layered structure. TwinScan lithographic apparatuses fabricated by ASML employ workpiece tables using the single-layered balance mass system, more information of which can be gleaned from U.S. Pat. No. 7,034,920, published on Apr. 25, 2006. This system utilizes a single-layered frame as a balance mass for balancing reactions from acceleration or deceleration movements of long-stroke motors in X, Y and Rz directions. In addition, this balance mass system for the workpiece table is in physical connection to the base frame via two five-rod mechanisms. These two five-rod mechanisms can accomplish position initialization and zeroing of the balance mass system of the workpiece table as well as tracking and correction of the balance mass system of the workpiece table during its movements. However, as the two five-rod mechanisms incorporate totally four control motors which act in concert to provide combined control in the X, Y and Rz degrees of freedom, this control scheme must involve a decoupling process and is hence associated with a high complexity.

Nikon's Tandem Stage provides an example of a two-stage table using a double-layered balance mass system, more information of which can be gleaned from U.S. Pat. No. 6,885,430, published on Apr. 26, 2005. The system has two layers of balance masses for respectively balancing reactions from acceleration or deceleration movements of long-stroke motors in X, Y and Rz directions, wherein an upper balance mass is configured to balance the reactions in one linear direction (X or Y) and reactions in the Rz direction. The upper and lower balance masses are connected by a linear motor which acts as a compensating motor to realize synchronized movements of the upper and lower balance masses with deviations compensated and corrected. The lower balance mass is configured to balance the reactions in the other linear direction (Y or X). The Tandem double-layered balance mass system employs three independent linear motors to connect the balance mass system of the workpiece table to the base frame. The stators of the linear motors are mounted on the base frame and the rotors are mounted on the lower balance mass of the workpiece table. These three linear motors can cooperate to accomplish the position initialization and zeroing of the balance mass system of the workpiece table as well as tracking and correction of the balance mass system of the workpiece table during its movements. As the three linear motors are capable of independent control in the X, Y and Rz degrees of freedom, this scheme does not need any decoupling process and thus allows easier control. However, the used linear motors are all of a special design of Nikon Corporation that takes in account backlash and displacement and could hence not be generalized to ordinary linear motors.

As described above, balance mass systems used in current lithography machines, represented by the ASML Twinscan system and Nikon Tandem system, all feature the use of independent balance mass systems for workpiece and mask tables, i.e., adoption of at least two such balance mass systems in the same lithography machine. This configuration is associated with the following drawbacks:

1) an overall structure lack of compactness;
2) necessity of using an additional support for the mask stage, which leads to an increase in both the size and mass of the lithography machine; and
3) a considerable total mass of used independent balance masses.

Therefore, there is an urgent need in this art for a balance mass system and a lithography machine with high structural compactness and a small size.

SUMMARY OF THE INVENTION

An objective of the present invention is to provide a balance mass system and a lithography machine, which can eliminate the need for using an additional support for the mask stage system and allow the construction of a lithography machine with a higher structural compactness, reduced size and weight, and reduced total mass of used balance masses.

To this end, the present invention provides the following technical solutions:

a balance mass system including a balance mass and an anti-drift and compensation apparatus. The balance mass system includes a first part for mounting thereon a workpiece stage system, a second part for mounting thereon a mask stage system, and a third part for interconnecting the first and second parts. The first part of the balance mass is floatingly supported on a base frame of a lithography machine, and the third part of the balance mass is in connection with the base frame via the anti-drift and compensation apparatus which is disposed in proximity to the center of gravity of the balance mass as a whole.

Preferably, the balance mass system further includes a movable countermass system which includes a countermass support and a countermass moving body. The countermass support is in fixed connection with the third part of the balance mass, and the countermass moving body is capable of upward and downward movements along the countermass support. Such movements can compensate for a real-time change in a center of gravity of the workpiece stage system, the mask stage system and the balance mass system as a whole and for a tilting moment of the balance mass system.

Preferably, the anti-drift and compensation apparatus is arranged at a same level as the center of gravity of the balance mass.

The present invention also provides a lithography machine, which includes an illumination system, a base frame, a primary vibration dumping means, a primary base plate mounted with an objective lens, a workpiece stage system for supporting a carrier of exposure photoresist, a mask stage system for supporting a carrier of exposure pattern, and a balance mass system as defined in the above paragraphs. The primary base plate is mounted on the base frame via the primary vibration dumping means. The workpiece stage system is floating supported on the first part of the balance mass, and the mask stage system is floating supported on the second part of the balance mass. The illumination system projects a pattern on the carrier of exposure pattern onto the carrier of exposure photoresist via the objective lens.

Preferably, the workpiece stage system includes a workpiece-stage coarse air foot, a workpiece-stage coarse moving stage, a workpiece-stage long-stroke drive motor and a workpiece-stage fine moving stage for supporting the carrier of exposure photoresist, the workpiece-stage coarse moving stage is floatingly supported on the first part of the balance mass via the workpiece-stage coarse air foot, the workpiece-stage fine moving stage is disposed on the coarse moving stage, the workpiece-stage coarse moving stage is connected to the first part of the balance mass via the long-stroke drive motor.

Preferably, the mask stage system includes a mask-stage long-stroke drive motor, a mask-stage coarse moving stage, a mask-stage coarse air foot, and a mask-stage fine moving stage for adsorbing the carrier of exposure pattern, the mask-stage coarse moving stage is floatingly supported on the second part of the balance mass via the mask-stage coarse air foot, the mask-stage fine moving stage is disposed on the coarse moving stage, the mask-stage coarse moving stage is connected to the second part of the balance mass via the long-stroke drive motor.

Preferably, the lithography machine further includes a workpiece-stage position measuring system. The workpiece-stage position measuring system includes a workpiece-stage interferometer support, a workpiece-stage interferometer, a first mirror for vertical reflection of the workpiece stage system and a second mirror for vertical reflection of the primary base plate, the workpiece-stage interferometer support is in fixed connection with the primary base plate, the second mirror for vertical reflection of the primary base plate is mounted on a lower side of the primary base plate, the first mirror for vertical reflection of the workpiece stage system is mounted on a side face of a workpiece-stage fine moving stage, the workpiece-stage interferometer measures a positional relation in a horizontal direction between the workpiece stage system and the objective lens by irradiating a horizontal measuring light beam on the workpiece-stage fine moving stage and a horizontal reference light beam on the objective lens, the workpiece-stage interferometer measures a positional relation in the vertical direction between the workpiece-stage fine moving stage and the objective lens by irradiating a vertical measuring light beam on the mirror for vertical reflection of the workpiece stage system which then reflects the beam onto the mirror for vertical reflection of the primary base plate.

Preferably, the lithography machine further includes a mask-stage position measuring system. The mask-stage position measuring system includes a mask-stage interferometer support, a mask-stage interferometer and a mirror for vertical reflection of the mask stage system for reflecting a vertical measuring beam from the interferometer, the mask-stage interferometer is in fixed connection with the primary base plate, the mirror for vertical reflection of the mask stage system is mounted on a side face of an upper portion of the objective lens, the mask-stage interferometer measures a positional relation in a horizontal direction between the mask stage system and the objective lens by irradiating a horizontal measuring light beam on the mask-stage fine moving stage and a horizontal reference light beam on the objective lens, the mask-stage interferometer measures a positional relation in the vertical direction between the mask-stage fine moving stage and the objective lens by irradiating a vertical measuring light beam on the mirror for vertical reflection of the mask stage system which then reflects the beam onto the mask-stage fine moving stage.

Preferably, the above-mentioned lithography machine further includes an illumination support, the illumination support is in fixed connection with the base frame and the illumination system is mounted over the carrier of exposure pattern via the illumination support.

Preferably, the primary base plate defines a through hole for so securing the objective lens that the objective lens is partially on one side of the primary base plate and partially on the other side of the primary base plate.

As described above, the balance mass system of the present invention includes a first part for mounting thereon the workpiece stage system, a second part for mounting thereon the mask stage system, a third part for interconnecting the above two parts and an anti-drift and compensation apparatus. Compared to the conventional lithography machine incorporating independent balance mass systems respectively for its workpiece stage system and mask stage system, the lithography machine of the present invention shares the same balance mass system between its workpiece stage system and mask stage system, and thus has the following advantages:

1) an improved overall structural compactness;

2) eliminating the need for using an additional support for the mask stage system by also supporting the mask stage system on the shared balance mass system, thereby reducing both the lithography machine size and mass; and 3) the workpiece stage system and the mask stage system commonly using the inventive balance mass system and the anti-drift and compensation apparatus thereof result in an additional cancellation between reaction forces from the object tables and hence allow the shared balance mass system to have a less total mass as compared to that of the conventional independent balance mass systems.

Further, the vertically moveable countermass system of the balance mass system can compensate for variations in center of gravity and for tilting moments, generated during movements.

BRIEF DESCRIPTION OF DRAWINGS

The balance mass system and the lithography machine of the present invention will be described below with reference to exemplary embodiments and the accompanying schematic drawing.

FIG. 1 schematically depicts a lithography machine in accordance with an embodiment of the present invention.

DETAILED DESCRIPTION

The present invention will be described in greater detail in the following description which demonstrates preferred embodiments of the invention, in conjunction with the accompanying drawings. Those of skill in the art should, in light of the present disclosure, appreciate that many changes can be made in the specific embodiments disclosed herein and still obtain the same beneficial results. Therefore, the following description should be construed as illustrative of the principles of the present invention, and not providing limitations thereto.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time consuming but would nevertheless be a routine undertaking for those of ordinary skill in the art.

The present invention will be further described in the following paragraphs by way of example with reference to the accompanying drawings. Features and advantages of the invention will be apparent from the following detailed description, and from the appended claims. Note that the accompanying drawings are provided in a very simplified form not necessarily presented to scale, with the only intention of facilitating convenience and clarity in explaining a few exemplary embodiments of the invention.

Referring now to FIG. 1, the lithography machine according to the present invention includes an illumination system 34, a base frame 1, a primary vibration damping means 2, a primary base plate 33 on which an objective lens 19 is mounted, a workpiece stage system for supporting a carrier of exposure photoresist 27, a mask stage system for supporting a carrier of exposure pattern 24, and a balance mass system. The primary base plate 33 is mounted on the base frame 1 via the primary vibration damping means 2. The illumination system 34 is configured to project a pattern of the carrier of exposure pattern 24 onto the carrier of exposure photoresist 27 via the objective lens 19.

The balance mass system includes a balance mass and an anti-drift and compensation apparatus 16. The balance mass includes a first part 11 for mounting thereon the workpiece stage system, a second part 20 for mounting thereon the mask stage system, and a third part 14, wherein the first part 11 of the balance mass is connected to the second part 20 of the balance mass via the third part 14 of the balance mass. The workpiece stage system is floatingly supported on the first part 11 of the balance mass, and the first part 11 of the balance mass is further floatingly supported on the base frame 1 of the lithography machine via e.g. a coarse air foot 8. The mask stage system is floatingly supported on the second part 20 of the balance mass, and the third part 14 of the balance mass is connected to the base frame 1 via the anti-drift and compensation apparatus 16, wherein the anti-drift and compensation apparatus 16 is disposed close to the center of gravity 15 of the balance mass as a whole.

Differing from the conventional lithography machines incorporating independent balance mass systems respectively for the workpiece stage system and mask stage system, the workpiece stage system and mask stage system of the lithography machine of the present invention commonly use the same balance mass system. As illustrated in the FIGURE, the first part 11 of the balance mass, the second part 20 of the balance mass and the third part 14 of the balance mass constitute the shared balance mass for the workpiece stage system and mask stage system. This design, in one aspect, can result in a higher structural compactness, in another aspect, the shared balance mass system can directly support the mask stage system, thus eliminating the need for an additional support for the mask stage system and resulting in reduced lithography machine size and weight; and in still another aspect, the workpiece stage system and the mask stage system commonly using the anti-drift and compensation apparatus 16 and the balance mass result in an additional cancellation between reaction forces from the object tables (i.e., the workpiece stage system and mask stage system) and hence allow the shared balance mass system to have a less total mass as compared to that of the conventional independent balance mass systems for the workpiece stage system and the mask stage system.

The anti-drift and compensation apparatus 16 is configured to control and compensate the horizontal directions (x, y, Rz) of the entire balance mass constituted by the first part 11 of the balance mass, the second part 20 of the balance mass and the third part 14 of the balance mass.

Preferably, the anti-drift and compensation apparatus 16 is arranged in correspondence to the center of gravity 15 of the entire balance mass. In this embodiment, the anti-drift and compensation apparatus 16 and the center of gravity 15 are located in the same vertical level. Stated in another way, they are set in the same horizontal plane. This arrangement can result in a better balance between reaction forces transferred from the workpiece stage system and the mask stage system to the base frame 1, thus reducing difficulties in vibration damping for the lithography machine and reliving the exposure system from the effects of the reaction forces.

As the long-stroke drive motor 13 of the workpiece stage and the long-stroke drive motor 21 of the mask stage are arranged in different levels and in different horizontal planes, a tilting moment will be inevitably caused. Further, when the workpiece stage system and the mask stage system move asynchronously, variations will arise in the center of gravity of the object tables and the balance mass system. To overcome these undesirable scenarios, the above-mentioned balance mass system may further include a countermass system which includes a countermass support 17 and a countermass moving body 18. The countermass support 17 may be fixedly connected to the third part 14 of the balance mass and the countermass moving body 18 may move upward and downward along the countermass support 17 so as to compensate for a real-time change in a center of gravity of the object tables and the balance mass system as a whole. Moreover, the countermass moving body 18 may further make an acceleration or deceleration movement to generate a counter moment for cancelling out the tilting moment of the object tables and the balance mass system.

Preferably, the workpiece stage system includes a coarse air foot 9 of the workpiece stage, a coarse moving stage 12 of the workpiece stage, the long-stroke drive motor 13 of the workpiece stage and a fine moving stage 10 of the workpiece stage for supporting the carrier of exposure photoresist 27, wherein the coarse moving stage 12 of the workpiece stage is floatingly supported on the first part 11 of the balance mass via the coarse air foot 9 of the workpiece stage, the fine moving stage 10 of the workpiece stage is disposed on the coarse moving stage 12, and the coarse moving stage 12 of the workpiece stage is connected to the first part 11 of the balance mass via the long-stroke drive motor 13.

Preferably, the mask stage system includes the long-stroke drive motor 21 of the mask stage, a coarse moving stage 22 of the mask stage, a coarse air foot 25 of the mask stage, and a fine moving stage 23 of the mask stage for adsorbing the carrier of exposure pattern 24, wherein the coarse moving stage 22 of the mask stage is floatingly supported on the second part 20 of the balance mass via the coarse air foot 25 of the mask stage, the fine moving stage 23 of the mask stage is disposed on the coarse moving stage 22, and the coarse moving stage 22 of the mask stage is connected to the second part 20 of the balance mass via the long-stroke drive motor 21.

Preferably, the lithography machine further includes a position measuring system for the workpiece stage. The position measuring system for the workpiece stage includes an interferometer support 32 of the workpiece stage, an interferometer of the workpiece stage (not shown) disposed on the interferometer support 32 of the workpiece stage, a mirror for vertical reflection 7 of the workpiece stage and a mirror for vertical reflection 3 of the primary base plate, wherein the interferometer support 32 of the workpiece stage is in fixed connection with the primary base plate 33, the mirror for vertical reflection 3 of the primary base plate is mounted on a lower side of the primary base plate 33, and the mirror for vertical reflection 7 of the workpiece stage is mounted on a side face of the fine moving stage 10 of the workpiece stage. The interferometer of the workpiece stage measures a positional relation in the horizontal direction between the workpiece stage system and the objective lens 19 by irradiating a horizontal measuring light beam 6 on the fine moving stage 10 of the workpiece stage and a horizontal reference light beam 4 on the objective lens 19. The interferometer of the workpiece stage measures a positional relation in the vertical direction between the fine moving stage 10 of the workpiece stage and the objective lens 19 by irradiating a vertical measuring light beam 5 on the mirror for vertical reflection 7 of the workpiece stage which then reflects the beam 5 onto the mirror for vertical reflection 3 of the primary base plate. Specifically, the horizontal measuring light beam 6 emitted from the interferometer of the workpiece stage is first irradiated onto the fine moving stage 10 of the workpiece stage and then reflected thereby back to the interferometer of the workpiece stage, with the horizontal reference light beam 4 from the interferometer of the workpiece stage being first directed onto the objective lens 19 and then reflected thereby back to the interferometer of the workpiece stage, and with the vertical measuring light beam 5 from the interferometer being first guided onto the mirror for vertical reflection 7 of the workpiece stage and then reflected thereby onto the mirror for vertical reflection 3 of the primary base plate and further reflected thereby back to the interferometer of the workpiece stage.

Preferably, the lithography machine may further include a position measuring system for the mask stage, which includes an interferometer support 30 of the mask stage, an interferometer of the mask stage (not shown) disposed on the interferometer support 30 of the mask stage, and a mirror for vertical reflection 31 of the mask stage for reflecting a vertical measuring beam 29 from the interferometer, wherein the interferometer support 30 of the mask stage is in fixed connection with the primary base plate 33, and the mirror for vertical reflection 31 of the mask stage is mounted on a side face of an upper portion of the objective lens 19. The interferometer of the mask stage measures a positional relation in the horizontal direction between the mask stage system and the objective lens 19 by irradiating a horizontal measuring light beam 26 on the fine moving stage 23 of the mask stage and a horizontal reference light beam 28 on the objective lens 19. The interferometer of the mask stage measures a positional relation in the vertical direction between the fine moving stage 23 of the mask stage and the objective lens 19 by means of the vertical measuring light beam 29. Specifically, the horizontal measuring light beam 26 emitted from the interferometer of the mask stage is first irradiated onto the fine moving stage 23 of the mask stage and then reflected thereby back to the interferometer of the mask stage, with the horizontal reference light beam 28 from the interferometer of the mask stage being first directed onto the objective lens 19 and then reflected thereby back to the interferometer of the mask stage, and with the vertical measuring light beam 29 from the interferometer of the mask stage being first guided onto the fine moving stage 23 via the mirror for vertical reflection 31 of the mask stage and then reflected thereby back to the interferometer of the mask stage.

Each of the primary base plate 33 and the objective lens 19, the interferometer of the workpiece stage, the interferometer of the mask stage and the mirror for vertical reflection 3 of the primary base plate, which are all mounted on the primary base plate 33, is isolated from the outside environment of the base frame 1 by the primary vibration damping means 2.

Preferably, the lithography machine further includes an illumination support 35, wherein the illumination support 35 is in fixed connection with the base frame 1, and the illumination system 34 is mounted over the carrier of exposure pattern 24 via the illumination support 35.

Preferably, the primary base plate 33 defines a through hole for so securing the objective lens 19 that the objective lens 19 is partially on one side (the lower side of the primary base plate 33 in this embodiment) of the primary base plate 33 and partially on the other side (the upper side of the primary base plate 33 in this embodiment) of the primary base plate 33.

As described above, the balance mass system of the present invention includes a first part for mounting thereon the workpiece stage system, a second part for mounting thereon the mask stage system, a third part for interconnecting the above two parts and an anti-drift and compensation apparatus. Compared to the conventional lithography machine incorporating independent balance mass systems respectively for its workpiece stage system and mask stage system, the lithography machine of the present invention shares the same balance mass system between its workpiece stage system and mask stage system, and thus has the following advantages:

1) an improved overall structural compactness;

2) eliminating the need for using an additional support for the mask stage system by also supporting the mask stage system on the shared balance mass system, thereby reducing both the lithography machine size and mass; and 3) the workpiece stage system and the mask stage system commonly using the inventive balance mass system and the anti-drift and compensation apparatus thereof result in an additional cancellation between reaction forces from the object tables and hence allow the shared balance mass system to have a less total mass as compared to that of the conventional independent balance mass systems.

Further, the vertically moveable countermass system of the balance mass system can compensate for variations in center of gravity and for tilting moments, generated during movements.

Obviously, those skilled in the art may make various modifications and alterations without departing from the spirit and scope of the invention. It is therefore in-tended that the invention be construed as including all such modifications and alterations insofar as they fall within the scope of the appended claims or equivalents thereof.

What is claimed is:

1. A lithography machine, comprising:
a base frame;
a primary base plate bearing an objective lens and an interferometer system, the primary base plate mounted on the base frame via a primary vibration dampening unit;
a workpiece stage system configured to support a carrier of exposure photoresist;
a mask stage system configured to support a carrier of exposure pattern;
an illumination system configured to project a pattern on the carrier of exposure pattern onto the carrier of exposure photoresist via the objective lens; and
a balance mass system comprising a balance mass and an anti-drift and compensation apparatus,
wherein the balance mass comprises:
a first part disposed on the base frame, the first part configured to support a workpiece stage system;
a second part configured to support the mask stage system; and
a third part configured to interconnect the first and second parts,
wherein the anti-drift and compensation apparatus is disposed in proximity to a center of gravity of the balance mass and is configured to connect the third part of the balance mass to the base frame, and
wherein the primary base plate is not in direct contact with any one of the first part, the second art and the third part of the balance mass.

2. The lithography machine of claim 1, wherein the balance mass system further comprises a movable countermass system which comprises a countermass support and a countermass moving body, the countermass support in fixed connection with the third part of the balance mass, the countermass moving body capable of upward and downward movements along the countermass support for compensating for a real-time change of a center of gravity of the workpiece stage system, the mask stage system and the balance mass system as a whole and a tilting moment of the balance mass system.

3. The lithography machine of claim 1, wherein the anti-drift and compensation apparatus is arranged at a same level as the center of gravity of the balance mass.

4. The lithography machine of claim 1, wherein the workpiece stage system comprises a workpiece-stage coarse air foot, a workpiece-stage coarse moving stage, a workpiece-stage long-stroke drive motor and a workpiece-stage fine moving stage for supporting the carrier of exposure photoresist, the workpiece-stage coarse moving stage floatingly supported on the first part of the balance mass via the workpiece-stage coarse air foot, the workpiece-stage fine moving stage disposed on the coarse moving stage, the workpiece-stage coarse moving stage connected to the first part of the balance mass via the long-stroke drive motor.

5. The lithography machine of claim 1, wherein the mask stage system comprises a mask-stage long-stroke drive motor, a mask-stage coarse moving stage, a mask-stage coarse air foot, and a mask-stage fine moving stage for adsorbing the carrier of exposure pattern, the mask-stage coarse moving stage floatingly supported on the second part of the balance mass via the mask-stage coarse air foot, the mask-stage fine moving stage disposed on the coarse moving stage, the mask-stage coarse moving stage connected to the second part of the balance mass via the mask-stage long-stroke drive motor.

6. The lithography machine of claim 1, further comprising a workpiece-stage position measuring system, the workpiece-stage position measuring system comprising a workpiece-stage interferometer support, a workpiece-stage interferometer, a first mirror for vertical reflection of the workpiece stage system and a second mirror for vertical reflection of the primary base plate, the workpiece-stage interferometer disposed on the workpiece-stage interferometer support, the workpiece-stage interferometer support in fixed connection with the primary base plate, the second mirror for vertical reflection of the primary base plate mounted on a lower side of the primary base plate, the first mirror for vertical reflection of the workpiece stage system mounted on a side face of a workpiece-stage fine moving stage, the workpiece-stage interferometer measuring a positional relation in a horizontal direction between the workpiece stage system and the objective lens by irradiating a horizontal measuring light beam on the workpiece-stage fine moving stage and a horizontal reference light beam on the objective lens, the workpiece-stage interferometer measuring a positional relation in a vertical direction between the workpiece-stage fine moving stage and the objective lens by means of a vertical measuring light beam from the workpiece-stage interferometer.

7. The lithography machine of claim 1, further comprising a mask-stage position measuring system, the mask-stage position measuring system comprising a mask-stage interferometer support, a mask-stage interferometer disposed on the mask-stage interferometer support, a mirror for vertical reflection of the mask stage system for reflecting a vertical measuring beam from the mask-stage interferometer, the mask-stage interferometer support in fixed connection with the primary base plate, the mirror for vertical reflection of the mask stage system mounted on a side face of an upper portion of the objective lens, the mask-stage interferometer measuring a positional relation in a horizontal direction between the mask stage system and the objective lens by irradiating a horizontal measuring light beam on a mask-stage fine moving stage and a horizontal reference light beam on the objective lens, the mask-stage interferometer measuring a positional relation in a vertical direction between the mask-stage fine moving stage and the objective lens by means of a vertical measuring light beam from the mask-stage interferometer.

8. The lithography machine of claim 1, further comprising an illumination support, wherein the illumination support is in fixed connection with the base frame and the illumination system is mounted above the carrier of exposure pattern via the illumination support.

9. The lithography machine of claim 1, wherein the primary base plate defines a through hole for so securing the objective lens that the objective lens is partially on one side of the primary base plate and partially on the other side of the primary base plate.

* * * * *